(12) United States Patent
Fotherby (10) Patent No.: US 8,526,206 B2
(45) Date of Patent: Sep. 3, 2013

(54) DRIVE CIRCUIT

(75) Inventor: Christopher William Fotherby, Manukau (NZ)

(73) Assignee: Power Concepts NZ Limited, Manukau (NZ)

( * ) Notice: Subject to any disclaimer, the term of this patent is extended or adjusted under 35 U.S.C. 154(b) by 427 days.

(21) Appl. No.: 12/667,788

(22) PCT Filed: Dec. 20, 2007

(86) PCT No.: PCT/NZ2007/000381
§ 371 (c)(1),
(2), (4) Date: Mar. 30, 2010

(87) PCT Pub. No.: WO2009/008739
PCT Pub. Date: Jan. 15, 2009

(65) Prior Publication Data
US 2011/0019454 A1    Jan. 27, 2011

(30) Foreign Application Priority Data
Jul. 9, 2007   (NZ) .......................... 556438

(51) Int. Cl.
*H02M 7/5388* (2007.01)

(52) U.S. Cl.
USPC .............................. 363/98; 363/127; 327/424

(58) Field of Classification Search
USPC ....... 363/17, 21.02, 21.03, 98, 132; 327/424, 327/427, 434
See application file for complete search history.

(56) References Cited

U.S. PATENT DOCUMENTS

| | | | |
|---|---|---|---|
| 3,377,541 A | 4/1968 | Farkas | |
| 3,626,244 A | 12/1971 | Holz | |
| 3,760,285 A | 9/1973 | Milberger et al. | |
| 4,070,663 A | 1/1978 | Kanatani et al. | |
| 4,443,719 A | 4/1984 | Planer et al. | |
| 4,873,460 A * | 10/1989 | Rippel | 327/437 |
| 4,947,311 A | 8/1990 | Peterson | |
| 4,967,109 A * | 10/1990 | Steigerwald | 327/434 |
| 5,051,609 A * | 9/1991 | Smith | 327/109 |
| 5,138,515 A * | 8/1992 | Bourgeois | 361/18 |
| 5,264,736 A * | 11/1993 | Jacobson | 327/365 |
| 5,786,687 A | 7/1998 | Faulk | |
| 5,910,746 A * | 6/1999 | Fordyce | 327/379 |
| 6,107,860 A * | 8/2000 | Vinciarelli | 327/427 |
| 6,114,814 A | 9/2000 | Shannon et al. | |
| 6,208,535 B1 * | 3/2001 | Parks | 363/26 |

(Continued)

FOREIGN PATENT DOCUMENTS
WO        0239788        5/2002

*Primary Examiner* — Adolf Berhane
*Assistant Examiner* — Fred E Finch, III
(74) *Attorney, Agent, or Firm* — Dann, Dorfman, Herrell and Skillman, P.C.

(57) ABSTRACT

The present invention relates to a DC to AC inverter comprising a plurality of voltage controlled switching devices, where one or more of the voltage controlled switching devices is driven by a drive circuit comprising: a bridge switching circuit (59), a transformer (28) with a primary winding (29) and a secondary-winding (30), a transition selection circuit (60) coupled to a control terminal of a respective voltage controlled switching device (40) of the inverter, at least one inductance (37) that forms at least one resonant circuit with the input capacitance (41) of the control terminal, wherein the bridge switching circuit (59) can be operated to generate drive pulses via the selection circuit (60) to operate the respective voltage controlled switching device (40).

11 Claims, 4 Drawing Sheets

(56) References Cited

U.S. PATENT DOCUMENTS

| | | | |
|---|---|---|---|
| 6,433,299 B1 * | 8/2002 | Varshney | 219/121.47 |
| 6,441,652 B1 * | 8/2002 | Qian | 327/108 |
| 6,519,168 B2 * | 2/2003 | Jain et al. | 363/98 |
| 6,570,413 B1 | 5/2003 | Kumagai et al. | |
| 6,650,169 B2 * | 11/2003 | Faye et al. | 327/404 |
| 6,804,125 B2 * | 10/2004 | Brkovic | 363/17 |
| 6,853,570 B2 | 2/2005 | De Vries | |
| 6,911,848 B2 * | 6/2005 | Vinciarelli | 327/108 |
| 6,961,251 B2 * | 11/2005 | Porter et al. | 363/21.01 |
| 7,440,301 B2 * | 10/2008 | Kirchmeier et al. | 363/132 |
| 2003/0164721 A1 * | 9/2003 | Reichard | 327/108 |
| 2004/0145921 A1 | 7/2004 | Chen et al. | |
| 2006/0017403 A1 * | 1/2006 | Matsushima | 315/291 |
| 2006/0290388 A1 * | 12/2006 | Tolle et al. | 327/108 |

* cited by examiner

PRIOR ART

DRIVE CIRCUIT

FIELD OF THE INVENTION

The present invention relates to a circuit for reducing the standby power of DC to AC inverters that utilise voltage controlled power switching devices.

BACKGROUND OF THE INVENTION

There is increasing use being made of DC to AC inverters as a source of power for mains appliances, either in remote locations that do not have a connection to a mains supply grid, as part of an un-interruptible power supply which provides mains power in the event of a sudden interruption in the supply of grid connected power, or to connect sources of renewable energy such as wind or solar to the grid. In remote power applications it has been common for inverters to only be switched on when there is a need to operate a mains powered appliance. However, many mains appliances are now designed to operate in a standby mode when not actively being used. An example of this is a video recorder which goes into a low power standby mode while it is waiting to start recording a program. A second example is a television set that can be brought out of standby mode by the power button on its remote control. Both these examples require a continuous supply of power, even when the appliances are not actively being used. In view of this it is becoming common for inverters to be turned on continuously. When this is done the standby power of the inverter itself can become significant, especially in installations where there is a limited amount of power, such as those using solar panels, or in installations where the inverter is run from a storage battery that is recharged periodically and must supply all the installation's power between each recharge. Most of the standby power is the power required to operate the circuitry of the inverter, so this power is also being consumed even when there is power passing through the inverter. Reducing the standby power will improve the efficiency of an inverter, which is an important consideration for inverters that connect sources of renewable energy to the grid.

Most commercially available inverters utilise voltage controlled power switching devices such as MOSFETs or IGBTs. Many use a combination of these two devices. For both of these devices the name of the control terminal or electrode is the gate. The inverters that provide substantially pure sine wave outputs generally use some form of pulse width modulation (PWM) that requires that the power switching devices be turned on and off rapidly, commonly with a PWM switching frequency that is between 20 kHz and 100 kHz. MOSFETs and IGBTs have a significant gate capacitance that must be charged to turn the device on and discharged to turn it off. The power required to charge and discharge the gate capacitance of each device once per PWM cycle forms a significant part of an inverter's standby power. This "gate drive" power becomes even more significant as the switching frequency is increased. However, it is desirable to increase the PWM switching frequency as this allows the size and cost of filter inductors and capacitors in the inverter to be reduced. New voltage controlled switching devices are being developed such as silicon carbide junction FETs. It is likely that these devices will also have significant gate capacitances.

Figure 1:
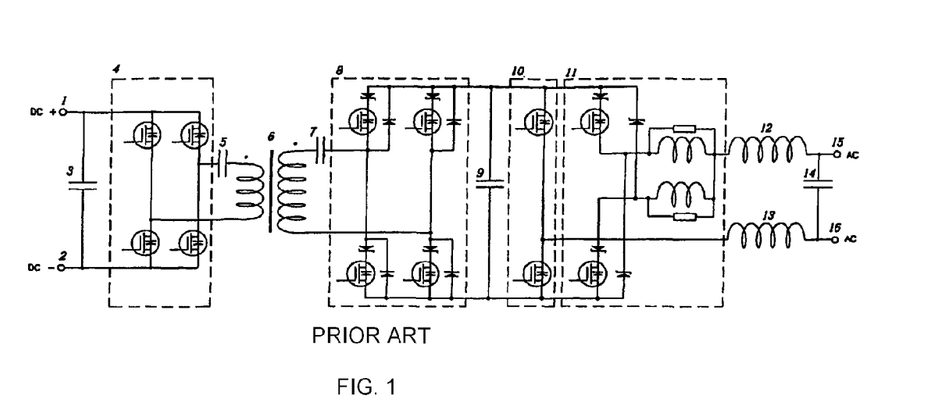
FIG. 1 is a circuit diagram of a typical DC to AC inverter.

FIG. 1 shows the circuit of a typical DC to AC inverter suitable for converting a source of DC power to a standard mains electrical AC voltage and frequency with a substantially pure sine wave output. The inverter is of a general type well known in the art where a DC to DC converter utilising a high frequency transformer steps up the voltage of the source of DC power to a higher DC voltage, which in turn is converted to a mains voltage AC output by means of pulse width modulation (PWM) followed by low pass filtering. To simplify the drawing, no drive circuits have been shown for the power switching devices. The inverter circuit shown makes use exclusively of MOSFETs, but IGBTs could also be used for some or all of the high voltage power switches.

The DC to DC converter is of a type known as a voltage sourced dual active bridge. Section 4 contains a full bridge of low voltage power switches while section 8 contains a full bridge of high voltage power switches. These two bridges are switched in unison so as to apply a substantially square voltage waveform to the high frequency transformer 6. Power is able to be transferred either from the low voltage reservoir capacitor 3 to the high voltage reservoir capacitor 9, or in the reverse direction. The ratio of the voltage across the low voltage reservoir capacitor to the voltage across the high voltage reservoir capacitor is substantially equal to the turns ratio of the high frequency transformer. When the DC to DC converter first starts operating it is necessary to apply short pulses to the transformer instead of square waves in order to limit the current flowing into the high voltage reservoir capacitor. Once the voltage across this capacitor has reached a value close to the final operation voltage the switching of the devices in the two bridges can be adjusted so that a substantially square wave is applied to the transformer. Thus it is necessary for the gate drive circuits for all the power switching devices in these two bridges to be able to switch the devices on for a range of time intervals from one that is short in comparison to the switching cycle to one that is close to half of the switching cycle.

The PWM operation is performed by two half bridges. The first is contained in section 10. This is a low frequency half bridge where each device is switched on for half a mains cycle then off for half a mains cycle and both devices are switched on and off out of phase with each other. The gate drive circuit required to perform this low frequency switching operation is not covered herein. The second half bridge is shown in section 11 and is a high frequency PWM circuit which produces first a positive half sine wave with a zero reference equal to the negative high voltage rail, followed by a negative half sine wave with a zero reference equal to the positive high voltage rail. The output of the PWM circuit is filtered and applied to one of the inverter output terminals while the other output terminal is connected to the output of the low frequency half bridge, resulting in the voltage generated across the two output terminals being a complete sine wave with both positive and negative excursions. At the start and end of each half sine wave one of the power switching devices in the PWM circuit should be turned on for a complete PWM cycle while the second device needs to be turned off whenever the first device is on. As the half sine wave moves towards its peak the first device is progressively turned off for a greater and greater percentage of the cycle while the second device is turned on for matching progressively longer periods. This requires gate drive circuits that can turn power switching devices on for a range of periods from zero to 100% of the PWM cycle. Many gate drive circuits are not able to provide this range of periods. In practice it is possible to produce acceptable sine waves if the power switching devices can be switched on for time intervals that range from slightly greater than zero to slightly less than 100% of the PWM cycle. For example, if the PWM cycle is 10 microseconds long, then a suitable minimum on time is in the order of 100 nanoseconds and a suitable maximum on time is in the order of 9.9 microseconds.

In any half bridge circuit (including the two halves of a full bridge circuit), when one of the power switching devices is turned on it applies a rapid change of voltage across the other device, which should already be turned off at this point if a short circuit across the power supply is to be avoided. It is common for this rapid change to be coupled through inter-electrode capacitances to the gate of the "off" device. If the signal coupled to the gate is large enough to turn the device on then both devices will be on at the same time and the resulting short circuit will cause a large amount of current to flow through the devices, in many cases resulting in the destruction of both devices. One of the most effective means to prevent this is to ensure that during the off period the gate of the switching device is held at a voltage sufficiently far away from the turn-on threshold of the device that the voltage coupled through the inter-electrode capacitances does not cause the gate voltage to cross the turn-on threshold. For MOSFETs and IGBTs this means that during the off period the gate should be held at a negative voltage with respect to the source or emitter electrode. The magnitude of the negative voltage applied to the gate depends on the expected size of the voltage change coupled through the inter-electrode capacitances.

Most inverters that are designed to draw their power from batteries use a nominal DC supply voltage between 12 and 48V. This DC supply voltage is classed as safe to touch by electrical safety organisations and requires minimal insulation of the supply conductors and terminals. Conversely, the voltages present in the high voltage side of the inverter is classed as hazardous and must be provided with a prescribed amount of insulation and isolation from any conductor that can be touched by a person in order to meet the relevant electrical safety regulations. In the field of electrical safety two circuits that have no conductive path between them are said to be galvanically isolated. Also, the distance through the air from a conductor in a hazardous voltage circuit to a conductor in a safe to touch circuit is known as a clearance distance and the distance between these two points measured along the surface of an insulator is known as a creepage distance.

It is common for the control circuit of the inverter to be powered from the DC supply voltage. The control circuit generates the switching signals required to operate the inverter and applies these signals to the gate drive circuits which generate the voltages and currents necessary to turn the power switching devices on and off. Because the control circuit is connected to the DC supply voltage it is necessary for the gate drive circuits that control the high voltage switching devices to provide isolation that meets the requirements of the electrical safety regulations. The regulations mandate such things as the minimum thickness of insulation and the minimum clearance and creepage distances. In addition, many of these regulations require that isolation be maintained even after one fault has developed in the equipment. For MOSFET or IGBT switches utilising gate drive circuits where the isolation is provided by a transformer the fault that is often considered is a short circuit from the drain or collector of the switching device to its gate. This has the potential to cause a large current to flow through the winding on the high voltage side of the gate transformer, potentially over-heating it and melting the insulation between the high voltage side and the control circuit side of the transformer. It is often desirable for the gate drive circuits that control the low voltage switching device to provide galvanic isolation but there is normally no need to comply with electrical safety regulations. The inverter depicted in FIG. 1 represents one possible design for a DC to AC inverter.

There are many other possible designs. One feature that they all have in common is the large number of power switching devices. This is especially true of inverters that use pulse width modulation to produce substantially pure sine wave outputs. In addition, each power switch in the low voltage section may be constructed from two or more individual switching devices connected in parallel and each power switch in the high voltage section may be constructed from two or more individual switching devices connected in series. This all adds up to a large number of switching devices and a similarly large number of gate drive circuits. Thus it is necessary for each gate drive circuit to be as simple as possible or else the cost of and the space required by all the gate drive circuits together would be unacceptable. Many known isolated gate drive circuits require a power supply for the circuitry on the switching device side of the circuit. Often this leads to a separate power supply being required for each power switching device. The power supplies for the high voltage devices must meet the same isolation standards as the gate drive circuits themselves. These factors often lead to a very complex design if gate drive circuits requiring separate power supplies are used.

U.S. Pat. Nos. 3,377541, 3,626,244, 3,760,285, 4,070,663, and 6,853,570 disclose circuits that use a resonating inductor to reduce the power required to repeatedly charge and discharge a capacitor. However, all these circuits require one or more power supplies to be connected to the circuit containing the capacitor and are therefore not suitable for producing a simple isolated gate drive circuit for a low standby power DC to AC inverter.

U.S. Pat. Nos. 4,443,719, 5,138,515, and 5,786,687 disclose circuits that use short pulses coupled through a transformer to turn a power switching device on and off. However, none of these circuits use resonance to reduce the power required to repeatedly charge and discharge the gate capacitance.

Only the circuit in U.S. Pat. No. 4,443,719 can hold a negative voltage on the gate during the off interval. However, this circuit uses the breakdown voltage of zener diodes to hold both the positive and negative voltages on the gate. As a result this circuit would require more power to drive the gate of a power switching device than most other circuits as the positive and negative pulses must have a magnitude that is large enough to break down the zener diodes and then charge or discharge the gate capacitance to the required voltage. For example, a typical high voltage MOSFET requires at least 10V on its gate to fully turn on. A circuit that charges the gate capacitance of one of these MOSFETs via a diode and discharges it via a zener diode would need to use a 10V zener diode in order to prevent the gate capacitance from discharging through the zener while the MOSFET is switched on. The drive circuit would then need to supply a positive 10V pulse to turn the MOSFET on and a negative 10V pulse to turn it off A circuit that used a 10V zener in one direction connected in series with a 5V zener in the other direction would be able to hold +10V on the gate when the MOSFET is on and −5V on the gate when it is off, but would need +15V pulses to turn the MOSFET on and −15V pulses to turn it off. Some low voltage MOSFETs can be fully turned on by a gate voltage of 5V. For these devices all the voltages given in the preceding example should be halved.

In addition, none of the circuits in U.S. Pat. Nos. 4,443,719, 5,138,515, or 5,786,687 have provision to prevent a short circuit in the power switching device from damaging the gate drive transformer. All these shortcomings prevent these circuits from being used to produce a simple isolated gate drive circuit for low standby power DC to AC inverters.

SUMMARY OF THE INVENTION

An object of the present invention is to provide a DC to AC inverter with one or more drive circuits for its power switching devices.

Advantageously, the drive circuit might reduce the inverter standby power consumption over existing circuits.

Advantageously, the drive circuit might contain a smaller number of components and occupy a smaller area on the circuit board than existing circuits.

Advantageously, the drive circuit might isolate the switching devices from the inverter control circuit.

In one aspect the present invention may be said to consist in a DC to AC inverter comprising a plurality of voltage controlled switching devices, each having a control terminal with an associated input capacitance and two or more other terminals, where one or more of the voltage controlled switching devices is driven by a drive circuit comprising:

a bridge switching circuit with power inputs for receiving one or more DC voltages, a transformer with a primary winding and a secondary winding, the primary winding being coupled to the bridge switching circuit, a transition selection circuit coupled to the secondary winding of the transformer and also coupled to a control terminal of a respective voltage controlled switching device of the inverter, the transition selection circuit having at least two active devices adapted to conduct current between the secondary winding and the control terminal of the respective voltage controlled switching device for controlling charge and discharge of the input capacitance of the respective voltage controlled switching device, and at least one inductance that forms at least one resonant circuit with the input capacitance of the control terminal, wherein the bridge switching circuit can be operated to generate drive pulses via the selection circuit that propagate into and resonate in the at least one resonant circuit to generate a resonated output during both charge and discharge that is fed to the input terminal to operate the respective voltage controlled switching device.

Preferably, at least one of the active devices in the selection circuit conducts current between the secondary winding and the control terminal when that active device is turned on during charge of the input capacitance, and at least one of the active devices in the selection circuit conducts current between the secondary winding and the control terminal when that active device is turned on during discharge of the input capacitance.

Preferably, the at least one inductance is an inductor coupled between the transition selection circuit and the input terminal of the respective voltage controlled switching device.

Preferably, the transformer comprises a non-conductive core that provides isolation between a primary side of the drive circuit and the respective voltage controlled switching device.

Preferably, the core comprises nickel-zinc ferrite.

Preferably the inverter further comprises a DC blocking capacitor coupled to block DC currents that would otherwise flow in the secondary winding of the transformer due to a fault, wherein the capacitor voltage rating is sufficient to satisfy electrical safety regulations.

Preferably, the bridge switching circuit comprises a first half bridge circuit adapted to switch an input voltage to apply a voltage of a first polarity across the primary winding of the transformer and a second half bridge circuit adapted to switch an input voltage to apply a voltage of a second polarity across the primary winding of the transformer.

Preferably, the first and second half bridge circuits receive input voltages of different magnitudes.

Preferably, the inverter further comprises a controller adapted to vary one or both input voltages received by the first and second half bridge circuits to reduce the gate drive power when there is little or no AC power being drawn from the inverter by decreasing one or both input voltages, and to improve the efficiency of the inverter when there is significant AC power being drawn by increasing one or both input voltages.

Preferably, the inverter comprises a plurality of drive circuits for driving two or more of the voltage controlled switching devices, each drive circuit being the same or different to the other drive circuits and being a drive circuit according to any one of claims 1 to 9.

In another aspect, the present invention may be said to consist in a DC to AC inverter Comprising a plurality of voltage controlled switching devices, each having a control terminal with an associated input capacitance and two or more other terminals, where one or more of the voltage controlled switching devices is each driven by a separate circuit comprising:

a transformer with a primary winding with a first terminal and a second terminal and a secondary winding with a third terminal and a fourth terminal, and a secondary side circuit comprising one or more inductances and adapted to couple the third terminal of the secondary winding to the control terminal of the voltage controlled switching device and to couple the fourth terminal of the secondary winding to one of the other terminals of the voltage controlled switching device, and a bridge circuit comprising a first sub-circuit connected to the first terminal of the primary winding and a second sub-circuit connected to the second terminal of the primary winding, adapted to switch voltages across the primary winding in order to generate voltages on the secondary winding for controlling the voltage controlled switching device, and a fifth primary side reference terminal connected to both sub-circuits, and a sixth voltage supply terminal connected to the first sub-circuit, and a seventh voltage supply terminal connected to the second sub-circuit, wherein the first sub-circuit is operable to connect the first terminal of the primary winding to the sixth voltage supply terminal when a positive voltage is required at the terminals of the secondary winding and to connect the first terminal of the primary winding to the fifth primary side reference terminal at other times, and the second sub-circuit is operable to connect the second terminal of the primary winding to the seventh voltage supply terminal when a negative voltage is required at the terminals of the secondary winding and to connect the second terminal of the primary winding to the fifth primary side reference terminal at other times, and the secondary side circuit is adapted to be non-conductive for current flow in both directions whenever the magnitude of the voltage at the terminals of the secondary winding is less than a defined value, and the secondary side circuit is adapted so that whenever a positive voltage with a magnitude greater than a defined value appears at the terminals of the secondary winding the secondary side circuit is rendered conductive for current flow into the control terminal of the voltage controlled switching device and non-conductive for current flow in the opposite direction and the voltage drop caused by the flow of current through the secondary side circuit is substantially less than the positive voltage at the terminals of the secondary winding, and the secondary side circuit is adapted so that whenever a negative voltage with a magnitude greater than a defined value appears at the terminals of the secondary winding the secondary side circuit is rendered conductive for current flow out of the control terminal of the voltage controlled switching device and non-conductive for current flow in the opposite direction and the voltage drop caused by the flow of current through the secondary side circuit is substantially less than the negative voltage at the terminals of the secondary winding, and the secondary side circuit is adapted so that whenever there is current flows in it the one or more inductances resonate with the capacitance associated with the control terminal of the voltage controlled switching device so that this capacitance becomes charged to a voltage substantially larger than it would be without the resonance.

In this specification where reference has been made to patent specifications, other external documents, or other sources of information, this is generally for the purpose of providing a context for discussing the features of the invention. Unless specifically stated otherwise, reference to such external documents is not to be construed as an admission that such documents, or such sources of information, in any jurisdiction, are prior art, or form part of the common general knowledge in the art The term "comprising" as used in this specification means "consisting at least in part of". Related terms such as "comprise" and "comprised" are to be interpreted in the same manner.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting

BRIEF DESCRIPTION OF THE DRAWINGS

Preferred embodiments of the invention will be described with reference to the drawings, of which.

DETAILED DESCRIPTION OF THE PREFERRED EMBODIMENTS

Figure 2:
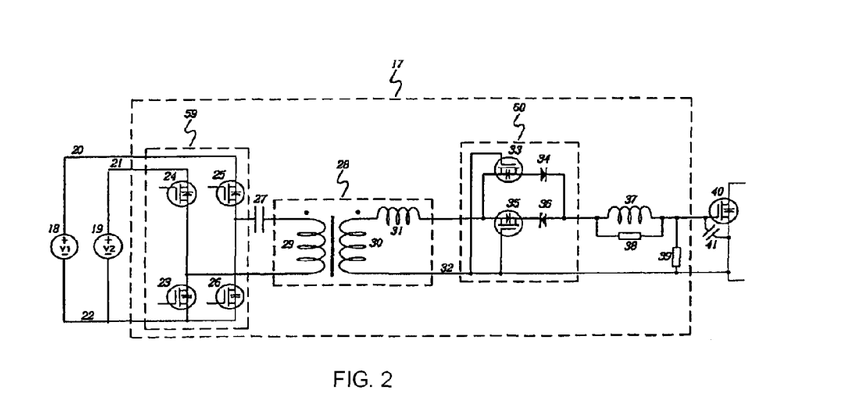
FIGS. 2 to 8 inclusive are circuit diagrams of possible embodiments of a drive circuit for a voltage controlled power switching device.

One embodiment of the drive circuit 17 for a control input of a voltage controlled power switching device (or voltage controlled switch) is shown in FIG. 2. The switching device could be, for example, a MOSFET or other voltage controlled semiconductor switch. The switching device can be turned on and off by applying a suitable voltage to a control input, which is termed the gate for MOSFETs. The drive circuit 17 can be utilised in a DC to AC inverter such as in FIG. 1. A DC to AC inverter will contain a controller that determines when all the power switching devices in the inverter need to be turned on or off. The output signals from the controller will be typically low power logic signals which cannot directly drive the switching devices and a drive circuit is required for this. The present invention can be used for this purpose, for example to drive most of the switching devices in the inverter of FIG. 1. Each actual drive circuit could differ slightly, depending on the requirements for the particular voltage controlled device being switched. The circuit in FIG. 2 comprises the switching device itself 40 that is being driven, along with the drive circuitry. The gate capacitance of the switching device is shown as capacitor 41.

In brief, the circuit comprises a primary side bridge switching circuit 59, a transformer 28, and a secondary side switching circuit 60. The circuit may comprise one or more voltage sources, or these may be separate from and connected to the drive circuit when required. The bridge switching circuit switches the voltage sources to apply voltages to a primary winding of the transformer 29. This generates an associated secondary voltage on the secondary winding 30. The secondary side switching circuit can couple this secondary voltage to the voltage controlled power switching device 40. To simplify the drawings the drive circuit for the primary side bridge switching circuit is not shown.

Referring to FIG. 2, the circuit will now be described in more detail. In the description, references are made to positive and negative voltages. It will be appreciated that this is for exemplary purposes only, and the invention should not be considered to be limited to either the positive or negative voltages as stated. Any suitable use of either a positive or negative voltage could be utilised in any case.

A first DC power supply 18, supplying $V_1$ volts, has its negative terminal connected to primary reference voltage connection 22 and its positive terminal connected to first positive supply voltage connection 20. A second DC power supply 19, supplying $V_2$ volts, has its negative terminal connected to primary reference voltage connection 22 and its positive terminal connected to second positive supply voltage connection 21.

The bridge switching circuit 59 comprises a first half-bridge circuit (which is one sub-circuit) and a second half-bridge circuit (which is another sub-circuit). The first half-bridge circuit, consisting of the series connection of first switching device 24 and a second switching device 23, connects from the second positive supply connection 21 to the primary reference connection 22 and has an output from the point where the two switching devices 23, 24 connect to each other. The second half-bridge circuit, consisting of the series connection of a third switching device 25 and a fourth switching device 26, connects from the first positive supply connection 20 to the primary reference connection 22 and has an output from the point where the two switching devices 25, 26 connect to each other. The switching devices are shown as MOSFETs in the drawing but those skilled in the art will recognise that other types of active devices could be used in place of the MOSFETs. Note that an active device is one where the flow of current through the device can be allowed or disallowed by changing the voltage or current applied to the device's control terminal. In some devices, such as MOSFETs, the control terminal only has influence over current flowing in one direction and cannot disallow current flow in the opposite direction. A MOSFET can be thought of as having an active direction (or active state) where the current flow can be influenced by the control terminal and a reverse direction (inactive state) where current can flow freely through the MOSFETs body diode irrespective of the state of the control terminal.

The "dot" end of the primary winding 29 of transformer 28 connects to the output of the second half-bridge circuit via a DC isolation capacitor 27. The non-dot end of the primary winding 29 of transformer 28 connects to the output of the first half-bridge circuit. The transformer 28 can be of the type commonly known as a gate drive transformer. Its turns ratio can be 1 to 1 or any other suitable ratio. The non-dot end of the secondary winding 30 of transformer 28 connects to the secondary reference voltage connection 32. The dot end of the secondary winding 30 of transformer 28 connects to a positive transition selection circuit 60 consisting of the series connection of a p-channel MOSFET 33 and a first diode 34, and also to a negative transition selection circuit consisting of the series connection of an n-channel MOSFET 35 and a second diode 36. The positive transition selection circuit and negative transition selection circuit form a transition (or secondary side) selection circuit 60. Note that the transformer leakage inductance depicted as inductor 31 does not exist as a separate component but is inherent in the transformer. The two transition selection circuits both connect to a first terminal of a resonating inductor 37. The second terminal of inductor 37 connects to the control terminal or input of the voltage controlled power switching device 40. If the gate capacitance 41 has a nominal value in the order of 2.8 nF then inductor 37 may have a value of, for instance, 200 nH. A damping resistor 38 is connected across inductor 37 in order to minimise ringing at the end of the positive or negative pulses. Resistor 38 might, for instance, have a value of 68 Ohm. In the drawing the power switching device is shown as a MOSFET, but it could be an IGBT, or a silicon carbide JFET, or any other device that has a high impedance control terminal and is switched between conducting and non-conducting states by changing the voltage on the control terminal. An optional pull-down resistor 39 ensures that the power switching device 40 is not turned on by leakage currents when the control terminal drive circuit is not active. Resistor 39 might, for instance, have a value of 100 k Ohm. A person skilled in the art will appreciate that a transition selection circuit could be constructed with active devices other than MOSFETs.

The circuit 17 works by charging and discharging the input capacitance 41 of the voltage controlled switching device 40. For example, a MOSFET can be transitioned from its off state to its on state by charging the input capacitance to a positive voltage. The time constant formed by the input capacitance 41 and any resistance that can discharge the capacitance is much longer than the time from one charge or discharge operation to the next charge or discharge operation. It is possible to add external capacitance in parallel with the input capacitance 41 in order to achieve this. In the intervals between charge and discharge operations the voltage applied to the primary winding 29 of the transformer 28 is close to zero. This is achieved by having the second and fourth switching devices 23 and 26 turned on, and first and third devices 24 and 25 turned off, which effectively short circuits the primary 29 of the transformer 28 and significantly reduces the ringing that would otheiwise occur at the end of each charge or discharge operation.

To apply a positive transition to the control terminal of the voltage controlled power switching device 40, the fourth switching device 26 is turned off and the third switching device 25 is turned on. After an interval at least long enough for the voltage on the control terminal of the voltage controlled power switching device to have substantially settled to some positive value, the third switching device 25 is turned off and the fourth switching device 26 is turned on. This interval of time might, for instance, be 120 ns. For the interval that the third switching device 25 is turned on, the dot end of the secondary winding 30 of transformer 28 will be at a positive voltage with respect to the secondary reference connection 32. The source terminals of the p-channel MOSFET 33 and the n-channel MOSFET 35 will be positive with respect to their respective gate terminals. The n-channel MOSFET 35 will remain in its off state while the p-channel MOSFET 33 will turn on and, via the first diode 34, apply a positive voltage with respect to the secondary reference connection 32 to the first terminal of the resonating inductor 37. With the connection made between the secondary winding 30 of the transformer 28 and the control terminal of the voltage controlled power switching device 40, current will start to flow from the secondary winding 30 of the transformer 28 to begin charging the input capacitance 41 of the voltage controlled power switching device 40. The resonating inductor 37 will resonate with the input capacitance 41 of power switching device 40 causing the charging current to follow a substantially half sinusoid shape and also causing the final positive voltage on the control terminal of the voltage controlled power switching device 40 to be significantly higher than the open circuit voltage at the secondary winding 30 of the transformer 28. The open circuit voltage is substantially equal to the supply voltage $V_1$ multiplied by the turns ratio of transformer 28. When the third switching device 25 is turned off and the fourth switching device 26 is turned back on the voltage across the secondary winding 30 of the transformer 28 returns to close to zero. As the voltage falls, the first diode 34 prevents any current being drawn out of the control terminal of the voltage controlled power switching device 40. The n-channel MOSFET 35 is in its off state so no current can be drawn out of the control terminal of the voltage controlled power switching device 40 through the second diode 36.

The process of generating a negative transition at the control terminal of power switching device 40 is the mirror image of the positive transition process. Starting with the second and fourth switching devices 23 and 26 both on and the first and third switching devices 24 and 25 both off, the second device 23 is turned off and the first device 24 is turned on. After the length of time required to generate the full negative transition, the first device 24 is turned off and the second device 23 is turned back on. For the interval that the first device 24 is turned on, the dot end of the secondary winding 30 of transformer 28 will be at a negative voltage with respect to secondary reference connection 32. The source terminals of the p-channel MOSFET 33 and the n-channel MOSFET 35 will be negative with respect to their respective gate terminals. The p-channel MOSFET 33 will remain in its off state while the n-channel MOSFET 35 will turn on and, via the second diode 36, apply a negative voltage with respect to secondary reference connection 32 to the first terminal of resonating inductor 37. A substantially half sinusoid of current will be drawn out of the input capacitance 41 of the voltage controlled power switching device 40, resulting in a negative transition. The resonant nature of the transition will cause the final negative voltage on the control terminal of voltage controlled power switching device 40 to be significantly more negative than the open circuit voltage at the secondary winding 30 of transformer 28. The open circuit voltage is substantially equal to the supply voltage $V_2$ multiplied by the turns ratio of transformer 28. When the first switching device 24 is turned off and the second switching device 23 is turned back on the voltage across the secondary winding 30 of transformer 28 returns to close to zero. The second diode 36 prevents any current flowing back into the control terminal of power switching device 40. The p-channel MOSFET 33 is in its off state so no current can flow into the control terminal of the voltage controlled power switching device 40 through the first diode 34.

In order that the drive circuit dissipates the minimum amount of power it is important that both the positive transition selection circuit and the negative transition selection circuit drop as little voltage as possible while they are conducting current. Prior art circuits that use zener diodes to perform one or both of these functions drop substantial voltages across the zener diodes and as a result will have a power dissipation that is many times higher than the circuit diclosed herein. By using a MOSFET and diode in series to form each transition selection circuit it is possible to have a voltage drop across the transition selection circuit of less than 1V while the charge or discharge currents are flowing. If other circuit configurations and/or active devices other than MOSFETs are used in the transition selection circuits the voltage drop may be smaller or larger than this value, but any well designed circuit in accordance with the invention will be able to achieve a voltage drop that is less than the breakdown voltage of a zener diode used to prevent current flow into or out of the gate capacitance between charge and discharge operations. In effect, the voltage drop caused by the flow of current through the secondary side circuit could be substantially less than the positive voltage at the terminals of the secondary winding If the transformer leakage inductance is comparable in value to the resonating inductor then the voltage applied to the transition circuit will be higher than if the transformer leakage inductance is significantly smaller than the resonating inductor. To enable the MOSFETs in the transition selection circuit to turn on with low values of open circuit voltage at the secondary 30 of the transformer 28 and thereby dissipate a minimum amount of power, it is desirable to use low gate threshold MOSFETs. However, this type of MOSFET has a gate-source breakdown voltage of typically 8V, so cannot be used if the transformer has a leakage inductance that is large enough to cause greater than 8V to be applied to the transition selection circuits. Also, a high leakage inductance transformer would produce more ringing on the leading and trailing edges of the pulses output from its secondary winding, which would impede the rapid and clean switch on and switch off of the MOSFETs in the transition selection circuits. For both these reasons it is desirable to use a transformer where the leakage inductance is small in comparison with the inductance of the resonating inductor. For instance, the transformer leakage inductance might be less than a third of the resonating inductor value.

In order to achieve the maximum power saving from the resonant drive technique it is important to choose voltage controlled power switching devices that have only a small parasitic resistance in series with the capacitance of the control terminal.

Having separate supply voltages for the positive and negative transitions enables the positive and negative voltages generated at the control terminal of the voltage controlled power switching device 40 to have different magnitudes. As even resonant techniques dissipate some power in the unavoidable resistances inherent in the circuit components, minimising the voltage swing at the control terminal of the voltage controlled power switching device 40 will minimise the power dissipated by the drive circuit. For instance, the minimum gate drive voltages for a power MOSFET might be +10V to turn it on and −5V to reliably turn it off. These voltages could be produced by the drive circuit disclosed herein by having a supply voltage $V_1$ of approximately 5V and a supply voltage $V_2$ of approximately 2.5V. If only a single supply voltage of 5V was used for both half-bridge circuits the control terminal voltage swing would approximately be from +12V to −12V. The power MOSFET would still turn on and off correctly, but the drive circuit would dissipate considerably more power than with the unequal voltages. Typical drive voltages for an IGBT are +15V to turn it on and −5V to reliably turn it off. For a silicon carbide JFET +4V is required to turn it on and −25V to turn it off. In this last case $V_2$ would need to be many times larger than $V_1$. Where there is a requirement to simplify the inverter circuitry in order to reduce cost or size it may be acceptable to use one supply voltage for both half bridge circuits and tolerate the higher power. dissipation. While many of the drawings herein show two separate supply voltages it is not intended that this exclude the single supply voltage case. The power savings achievable even with only a single voltage supply are still impressive. For instance, the drive circuit disclosed herein can drive the gate of an IPB60R099CP MOSFET manufactured by Infineon Technologies AG to plus and minus 14V when using only a single voltage supply of 5V while dissipating less than half the power of a non-resonant drive circuit.

As the transformer 28 has one magnitude of voltage applied across its primary winding 29 in one direction and a different magnitude applied in the other direction, with the length of application being substantially the same time in both directions, there would be a small net DC voltage across the primary winding 29 if it were connected directly across the outputs of the half-bridge circuits. This would cause a DC current to flow in the primary winding 29 of transformer 28 which could cause the transformer core to saturate. To prevent this, the capacitor 27 is used to isolate the DC voltage from the transformer. Capacitor 27 might, for instance, have a value of 4.7 micro Farad.

Figure 3:
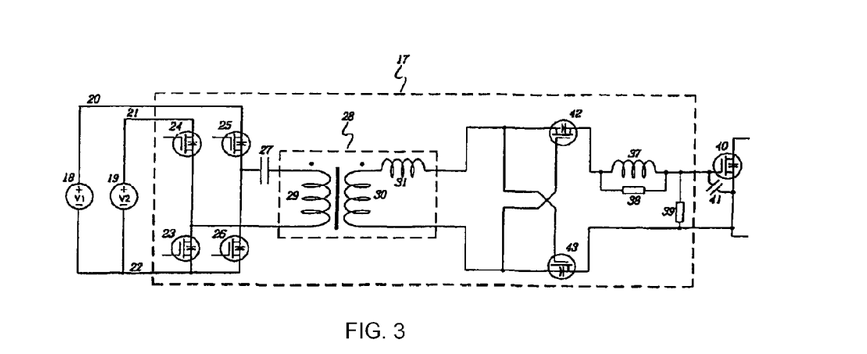

A second embodiment of the drive circuit 17 for a control input of a voltage controlled power switching device (or voltage controlled switch) is shown in FIG. 3. This differs from the embodiment shown in FIG. 2 only in the form of the transition selection circuit. Only the operation of the transition selection circuit will be described as the rest of the circuit operates identically to the embodiment shown in FIG. 2.

For a positive transition the dot end of the secondary winding 30 of the transformer 28 is positive with respect to its non-dot end. This means that the first n-channel MOSFET 42 will be held off while the second n-channel MOSFET 43 will be turned on. Current will flow through the body diode of the first n-channel MOSFET 42 and return via the second n-channel MOSFET 43.

For a negative transition the dot end of the secondary winding 30 of the transformer 28 is negative with respect to its non-dot end. This means that the first n-channel MOSFET 42 will be turned on while the second n-channel MOSFET 43 will be held off. Current will flow through the body diode of the second n-channel MOSFET 43 and return via the first n-channel MOSFET 42.

Note that it would be possible to use p-channel MOSFETs for devices 42 and 43. However, for similar on-resistances n-channel devices cost less and have generally better specifications than p-channel devices. As a result it would be unusual to use a p-channel device when it is possible to use an n-channel device.

Figure 4:
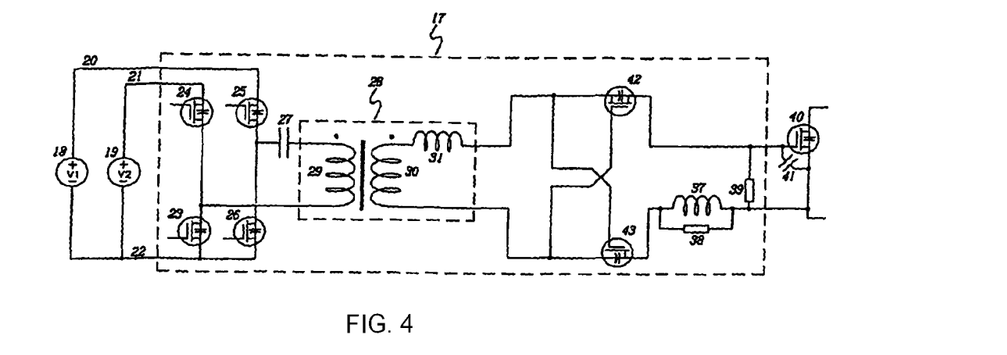

A third embodiment of the drive circuit 17 for a control input of a voltage controlled power switching device (or voltage controlled switch) is shown in FIG. 4. This differs from the embodiment shown in FIG. 3 only in that it shows an alternative location for the resonating inductor 37 and its associated damping resistor 38.

Figure 5:
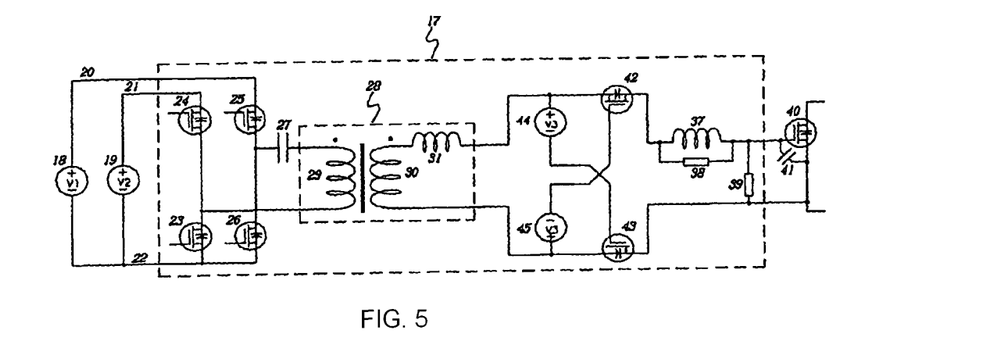

A fourth embodiment of the drive circuit 17 for a control input of a voltage controlled power switching device (or voltage controlled switch) is shown in FIG. 5. This is the same as the embodiment shown in FIG. 3 with the addition of a third voltage source 44 and a fourth voltage source 45. The third voltage source 44 is connected in series with the gate of the n-channel MOSFET 43. The fourth voltage source 45 is connected in series with the gate of the n-channel MOSFET 42. The purpose of the third and fourth voltage sources is to provide reverse bias to the gates of the MOSFETs they are connected to in order to prevent the MOSFETs from being turned on by ringing superimposed on the voltage pulses produced at the secondary winding 30 of the transformer 28. At the end of a positive transition when the voltage produced at the secondary winding 30 of the transformer 28 returns to close to zero, it is likely to ring or overshoot so that the dot end of the winding becomes negative with respect to the non-dot end for a short period of time. Without the reverse bias, if the voltage rings far enough negative, it will turn on the n-channel MOSFET 42 and start removing some of the charge that has just been delivered into the gate capacitance 41. The fourth voltage source 45 has its positive terminal connected to the non-dot end of the secondary winding 30 of the transformer 28 and its negative terminal connected to the gate of the n-channel MOSFET 42. The fourth voltage source 45 produces a voltage of $V_3$ so that the n-channel MOSFET 42 will only turn on if the voltage at the dot end of the secondary winding 30 of the transformer 28 is negative with respect to the non-dot end by a value larger than $V_3$ plus the turn-on threshold of n-channel MOSFET 42. Provided that the magnitude of the ringing is less than approximately half of the pulse producing the negative transition it is possible to select a value for $V_3$ so that n-channel MOSFET 42 turns on during the negative transition pulse but does not turn on during the ringing at the end of the positive transition pulse. Those skilled in the art will be able to see that similar reasoning can be applied to the operation of the third voltage source 44 and the n-channel MOSFET 43.

Figure 6:
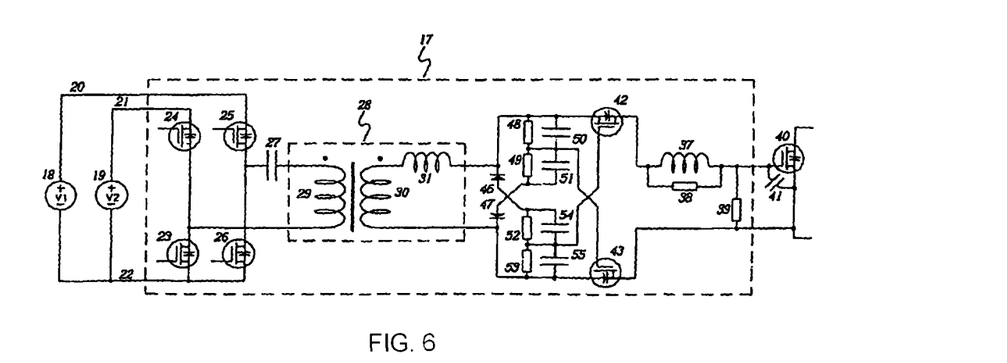

A fifth embodiment of the drive circuit 17 for a control input of a voltage controlled power switching device (or voltage controlled switch) is shown in FIG. 6. This shows a practical circuit for implementing the third and fourth voltage sources of the embodiment shown in FIG. 5.

The third voltage source 44 is implemented by a diode 47, two resistors 48 and 49, and two capacitors 50 and 51. The diode 47 rectifies the positive pulses that are output by the secondary winding 30 of the transformer 28 during positive transitions. The two resistors 48 and 49, and the two capacitors 50 and 51 together form a combined voltage divider and reservoir capacitor for the rectified pulses that pass through the diode 47. The value of the reverse bias voltage applied to the gate of the n-channel MOSFET 43 can be set by selecting the ratio of the value of the resistor 48 to the value of the resistor 49. The capacitor 50 provides a low impedance drive to the gate of the n-channel MOSFET 43 at high frequencies. The values of these components might be, for instance, 10 k Ohm for both resistors and 100 nF for both capacitors. As it is drawn in FIG. 6 this implementation of the voltage source 44 is simple to lay out on a printed circuit board. Those skilled in the art will be able to see that there are many other similar implementations that would achieve the same circuit operation.

The fourth voltage source 45 is implemented by a diode 46, two resistors 52 and 53, and two capacitors 54 and 55. The operation of this section of the circuit is that same as for the third voltage source except that it is the negative pulses that are rectified instead of the positive pulses.

Figure 7:
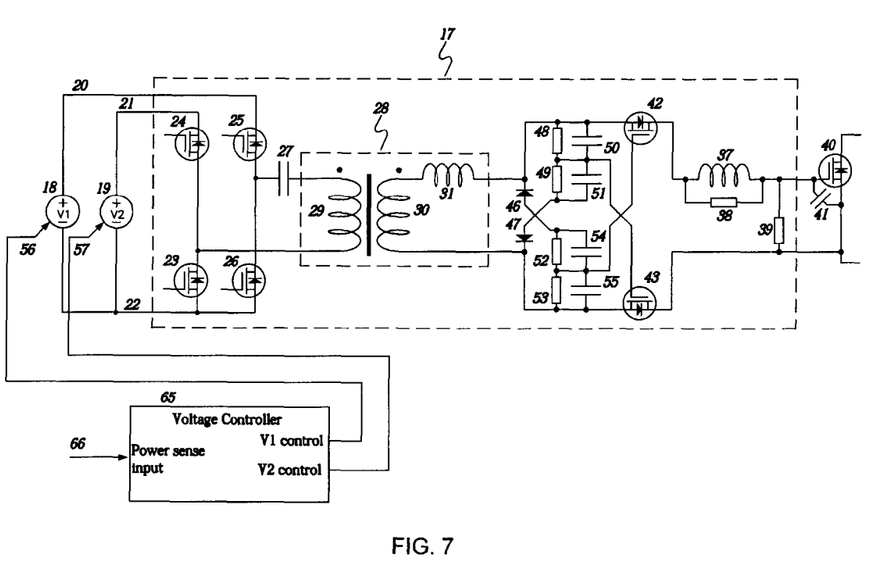
Figure 8:
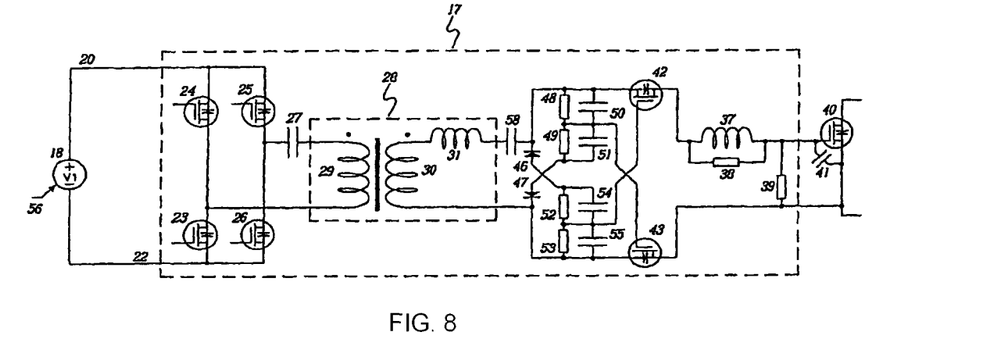

A sixth embodiment of the drive circuit 17 for a control input of a voltage controlled power switching device (or voltage controlled switch) is shown in FIG. 7. This is the same as the embodiment shown in FIG. 6 except that the first voltage source 18 has a voltage control input 56 and the second voltage source 19 has a voltage control input 57. The purpose of these voltage control inputs is to reduce the power dissipated by, the drive circuit when the DC to AC inverter is delivering no, or only a small amount of output power. This can be achieved by reducing the magnitude of the drive voltage applied to the voltage controlled switching device when the amount of output power is below a defined amount. In order to be able to apply this technique the voltage controlled switching device 40 must be of a type that can operate at one magnitude of drive voltage, but improve its performance as the drive voltage is increased. An example of where this is possible is in the low voltage bridge of the DC to AC inverter shown in FIG. 1. If the MOSFETs used in this bridge are of the type rated to work with a gate drive voltage of 4.5V, then the voltage control input 56 of the first voltage source 18 can be set to provide this level of gate drive at low inverter power output levels, and then increase the voltage of the first voltage source 18 at higher power levels. Increasing the gate drive voltage will reduce the on-resistance of the MOSFETs and improve the efficiency of the inverter at high output power levels. For example, the IRF6613 MOSFET manufactured by International Rectifier has a typical on-resistance of 3.1 milli Ohm with a gate drive voltage of 4.5V and 2.6 milli Ohm with a gate drive voltage of 10V. Although the embodiment shown in FIG. 7 shows both the first voltage source 18 and the second voltage source 19 as having voltage control inputs, this is not intended to exclude the case where only one of the voltage sources has a voltage control input. A seventh embodiment of the drive circuit 17 for a control input of a voltage controlled power switching device (or voltage controlled switch) is shown in FIG. 8. This is the same as the embodiment shown in FIG. 7 with the exception that both sub-circuits of the bridge switching circuit are connected to the first voltage source 18, and a DC blocking capacitor 58 has been placed in series with the dot end of the secondary winding 30 of the transformer 28.

The DC blocking capacitor 58 is not required for the circuit to operate correctly. Its purpose is to block current flow into the secondary winding 30 of transformer 28 if there is a short circuit inside power switching device 40. Many electrical safety regulations require that where a transformer connects between a circuit containing hazardous voltages and a circuit that is safe to touch, the insulation between the transformer windings should not be compromised by a single fault in the circuit such as a short circuit inside a power switching device. If a short circuit allowed a large current to flow in the secondary winding of the transformer, the temperature of the winding would be likely to exceed the melting point of the winding's insulation and cause a short circuit to the primary winding. The capacitor 58 could prevent any such large current from flowing. It should have a voltage rating that is higher than the supply voltage of the power switching device. The capacitor 58 might, for instance, have a value of 100 nF and a rated voltage of 630V.

As each charge or discharge pulse flows through the DC blocking capacitor 58 the voltage across this capacitor will change. The change is in the direction that adds to the ringing voltage at the end of the pulse, which makes the use of reverse bias voltages on the gates of the MOSFETs in the transition selection circuit even more necessary. The amount of charge that flows during a charge pulse must be equal to the amount that flows during a discharge pulse or else a DC voltage will build up across the capacitor 58. As a result it is not possible to produce different positive and negative drive voltages by using separate voltage sources for the two sub-circuits of the primary side bridge switching circuit. Whenever the on-time of the voltage controlled switching device is not equal to the off-time there is a net DC voltage across the resistor 39, resulting in a net DC current. This current will also cause a DC voltage to build up across the capacitor 58 and upset the operation of the drive circuit. To avoid this it may be necessary to considerably increase the value of the resistor 39 or to eliminate it entirely.

Those skilled in the art will recognise that the position of capacitor 58 shown in FIG. 8 is just one of many positions that would block the flow of DC current through the secondary winding 30 of the transformer 28.

It should be noted that while a single DC power supply is shown only in FIG. 8, a single DC power supply could replace the dual supplies shown in the other embodiments in the other Figures.

Conventional gate drive transformers use high permeability cores made from manganese-zinc ferrite. This material is conductive and it can be a challenge to construct a transformer with it that can meet the clearance and creepage distances set down in various electrical safety regulations.

The drive circuit disclosed herein uses pulse charge and discharge techniques so that only short pulses of voltage need to be applied to the primary winding of the gate drive transformer. As a result the magnetisation current in the transformer primary does not have time to build up to a large value. This makes it possible to use a transformer that has fewer turns and/or a lower permeability core than a transformer designed for a drive circuit that does not use short pulses. A transformer that can be constructed using a low permeability core can use a core made from nickel-zinc ferrite. It has been found that some grades of this material have sufficiently low conductivity that it can be classed as an insulator. Using such a core in the transformer 28 greatly simplifies the task of meeting electrical safety regulations and allows the size of the transformer to be reduced compared to transformers that use a conductive magnetic core.

Figure 9:
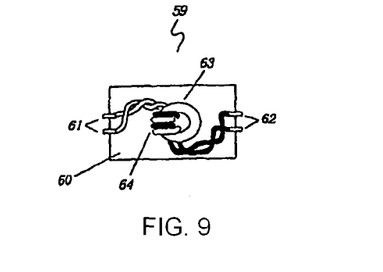
FIG. 9 is a schematic diagram of a transformer used in the drive circuits.

FIG. 9 shows a possible construction for a gate drive transformer that provides galvanic isolation and optionally complies with electrical safety regulations according to one embodiment of the invention. The transformer 59 comprises a mounting plate 60, primary terminals 61, secondary terminals 62, and transformer core 63 with windings 64, comprising a primary winding shown in white and a secondary winding shown in black. The core might be, for instance, a type commonly known as a ferrite bead, which is a hollow cylinder with approximate dimensions of, inside diameter 2 mm, outside diameter 4 mm, and length 5 mm. Both windings might be, for instance, two turns. Note that the turns of the primary winding are interleaved with the turns of the secondary winding and each turn is kept as close as possible to its adjacent turns. This minimises the leakage inductance of the transformer 59 and means that all the turns are bunched together on one side of the core instead of following the normal practice of being distributed evenly around the core. The connections from each winding to its respective terminals should be twisted together or otherwise held in close proximity to each other in order to further reduce the leakage inductance. For the same reason the primary terminals 61 should be as close to each other as practicable, as should the secondary terminals 62.

To assist in complying with electrical safety regulations the core 63 should be made from a material such as nickel-zinc ferrite that has conductivity low enough to be an insulator. With a core made from an insulating material the clearance and creepage distances will be at least as long as the distance from the primary terminals to the secondary terminals. If the core where conductive there would be clearance and creepage paths from the terminals for the transformer's primary to the core and other paths from the core to the terminals for the transformer's secondary, and, with a conductive core, the distance from one side of the core to the other is taken as zero for the purpose of calculating the total clearance and creepage distances.

The invention claimed is:

1. A PWM DC to AC inverter that outputs mains frequency power comprising a plurality of voltage controlled switching devices, each having a control terminal with an associated input capacitance and two or more other terminals, where one or more of the voltage controlled switching devices is driven by a drive circuit comprising:
   a full bridge switching circuit comprising a positive supply terminal, a negative supply terminal, a first output terminal, and a second output terminal, the positive supply terminal and negative supply terminal for receiving a DC supply voltage,
   a transformer with a primary winding and a secondary winding, the primary winding comprising a first end coupled to the first output terminal of the full bridge switching circuit and a second end coupled to the second output terminal of the full bridge switching circuit,
   a transition selection circuit coupled to the secondary winding of the transformer and also coupled to a control terminal of a respective voltage controlled switching device of the inverter, the transition selection circuit having at least two active devices adapted to conduct current between the secondary winding and the control terminal of the respective voltage controlled switching device for controlling charge and discharge of the input capacitance of the respective voltage controlled switching device, and
   at least one inductance that forms a single series resonant circuit with the input capacitance of the control terminal, wherein the full bridge switching circuit can be operated to generate drive pulses via the selection circuit that propagate into and resonate in the single series resonant circuit to generate a resonated output during both charge and discharge that is fed to the input terminal to operate the respective voltage controlled switching device.

2. A PWM DC to AC inverter according to claim 1 wherein at least one of the active devices in the selection circuit conducts current between the secondary winding and the control terminal when that active device is turned on during charge of the input capacitance, and at least one of the active devices in the selection circuit conducts current between the secondary winding and the control terminal when that active device is turned on during discharge of the input capacitance.

3. A PWM DC to AC inverter according to claim 1 wherein the at least one inductance is an inductor coupled between the transition selection circuit and the input terminal of the respective voltage controlled switching device.

4. A PWM DC to AC inverter according to claim 1 wherein the transformer comprises a non-conductive magnetic core that provides isolation between a primary side of the drive circuit and the respective voltage controlled switching device.

5. A PWM DC to AC inverter according to claim 4 wherein the magnetic core comprises nickel-zinc ferrite.

6. A PWM DC to AC inverter according to claim 1 further comprising one or more DC blocking capacitors coupled to block DC currents that would otherwise flow in the secondary winding of the transformer due to a fault, wherein the capacitor voltage ratings are sufficient to satisfy electrical safety regulations.

7. A PWM DC to AC inverter according to claim 1, the inverter comprising a plurality of drive circuits for driving two or more of the voltage controlled switching devices, each drive circuit being the same or different to the other drive circuits and being a drive circuit according to claim 1.

8. A PWM DC to AC inverter according to any preceding claim wherein the series resonant circuit comprises more than one inductance and/or more than one capacitance.

9. A PWM DC to AC inverter according to claim 1 further comprising a controller adapted to vary the DC supply voltage received by the full bridge switching circuit, whereby the controller is adapted to reduce the control terminal drive power when there is little or no AC power being drawn from the inverter by decreasing the DC supply voltage, and to improve the efficiency of the inverter when there is significant AC power being drawn by increasing the DC supply voltage.

10. A PWM DC to AC inverter according to claim 1 further comprising a first positive supply terminal and a second positive supply terminal, wherein the first positive supply terminal is coupled to the section of the full bridge switching circuit that drives the first output terminal and the second positive supply terminal is coupled to the section of the full bridge switching circuit that drives the second output terminal, the first and second positive supply terminals adapted to receive DC supply voltages of different magnitudes.

11. A PWM DC to AC inverter according to claim 10 further comprising a controller adapted to vary one or both of the DC supply voltages received by the full bridge switching circuit, whereby the controller is adapted to reduce the control terminal drive power when there is little or no AC power being drawn from the inverter by decreasing one or both of the DC supply voltages, and to improve the efficiency of the inverter when there is significant AC power being drawn by increasing one or both of the DC supply voltages.

* * * * *

UNITED STATES PATENT AND TRADEMARK OFFICE
CERTIFICATE OF CORRECTION

PATENT NO.       : 8,526,206 B2                                                Page 1 of 1
APPLICATION NO. : 12/667788
DATED            : September 3, 2013
INVENTOR(S)      : Christopher William Fotherby It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 507 days.

Signed and Sealed this

Fifteenth Day of September, 2015

Michelle K. Lee
*Director of the United States Patent and Trademark Office*